United States Patent
Jung et al.

(10) Patent No.: US 9,532,446 B2
(45) Date of Patent: Dec. 27, 2016

(54) PRINTED CIRCUIT BOARD INCLUDING LINKING EXTENDED CONTACT PAD

(71) Applicant: GIGALANE CO., LTD., Gyeonggi-do (KR)

(72) Inventors: Kyung Hun Jung, Seoul (KR); Ik Soo Kim, Gyeonggi-do (KR); Yuck Hwan Jeon, Gyeonggi-do (KR); Hee Seok Jung, Gyeonggi-do (KR); Hwang Sub Koo, Gyeonggi-do (KR); Hyun Je Kim, Gyeonggi-do (KR)

(73) Assignee: GIGALANE CO., LTD., Gyeonggi-Do (KR)

( * ) Notice: Subject to any disclaimer, the term of this patent is extended or adjusted under 35 U.S.C. 154(b) by 303 days.

(21) Appl. No.: 14/172,187

(22) Filed: Feb. 4, 2014

(65) Prior Publication Data

US 2015/0068796 A1 Mar. 12, 2015

(30) Foreign Application Priority Data

Sep. 6, 2013 (KR) .................. 10-2013-0107548
Dec. 20, 2013 (KR) .................. 10-2013-0160622

(51) Int. Cl.
*H05K 1/02* (2006.01)
*H05K 1/03* (2006.01)

(52) U.S. Cl.
CPC ............ *H05K 1/025* (2013.01); *H05K 1/0242* (2013.01); *H05K 1/0393* (2013.01)

(58) Field of Classification Search
None
See application file for complete search history.

(56) References Cited

U.S. PATENT DOCUMENTS

| 2,703,854 | A | * | 3/1955 | Eisler | .................. | H01F 17/0006 |
| | | | | | | 156/182 |
| 3,271,214 | A | * | 9/1966 | Tabor | .................. | H01B 7/0838 |
| | | | | | | 100/315 |
| 5,262,590 | A | * | 11/1993 | Lia | .................. | H01B 7/0861 |
| | | | | | | 156/55 |
| 5,274,401 | A | * | 12/1993 | Doggett | .................. | B41J 2/395 |
| | | | | | | 347/148 |
| 6,057,600 | A | * | 5/2000 | Kitazawa | .................. | H01L 23/66 |
| | | | | | | 257/691 |

(Continued)

FOREIGN PATENT DOCUMENTS

KR 10-1153165 5/2012

OTHER PUBLICATIONS

FRoHSyPCB. "Solder and PCB issues", Dr. Paul Goodman.*

*Primary Examiner* — Jeremy C Norris
*Assistant Examiner* — Muhammed Azam
(74) *Attorney, Agent, or Firm* — Harness, Dickey & Pierce, P.L.C.

(57) ABSTRACT

A printed circuit board (PCB) used as a signal transmission line of a terminal, comprising a first ground layer elongating in one direction, a first dielectric layer deposited on a top of the first ground layer and elongating in the same direction as the first ground layer, a signal transmission line deposited on a top of the first dielectric layer and elongating in the same direction as the first dielectric layer, a ground pad elongating from one end of the first ground layer and in contact with an external ground, and a signal line pad extended from one end of the signal transmission line and in contact with an external signal line.

16 Claims, 15 Drawing Sheets

(56) References Cited

U.S. PATENT DOCUMENTS

| | | | | |
|---|---|---|---|---|
| 6,313,912 B1* | 11/2001 | Piske | | G01C 15/004 33/366.12 |
| 6,326,553 B1* | 12/2001 | Yim | | G11B 5/40 174/254 |
| 6,373,740 B1* | 4/2002 | Forbes | | G11C 5/063 333/238 |
| 6,380,493 B1* | 4/2002 | Morita | | G11B 5/486 174/254 |
| 6,414,820 B1* | 7/2002 | Coon | | G11B 5/486 360/245.9 |
| 6,531,346 B1* | 3/2003 | Kim | | H01L 29/66765 257/E21.414 |
| 6,535,083 B1* | 3/2003 | Hageman | | H01P 1/207 333/208 |
| 6,631,551 B1* | 10/2003 | Bowles | | H01C 7/003 29/620 |
| 6,700,748 B1* | 3/2004 | Cowles | | G11B 5/40 360/245.9 |
| 6,846,991 B2* | 1/2005 | Girard | | G11B 5/11 174/250 |
| 7,006,331 B1* | 2/2006 | Subrahmanyam | | G11B 5/4826 360/234.6 |
| 7,142,395 B2* | 11/2006 | Swanson | | G11B 5/484 360/244.3 |
| 7,414,814 B1* | 8/2008 | Pan | | G11B 5/486 360/245.9 |
| 7,439,449 B1* | 10/2008 | Kumar | | G02B 6/4292 174/254 |
| 7,532,438 B1* | 5/2009 | Mei | | G11B 5/484 360/245.8 |
| 7,550,842 B2* | 6/2009 | Khandros | | H01L 23/13 174/260 |
| 7,554,829 B2* | 6/2009 | Forbes | | H01L 23/5225 333/238 |
| 7,724,475 B2* | 5/2010 | Nishiyama | | G11B 5/484 174/254 |
| 7,737,365 B2* | 6/2010 | Ishii | | G11B 5/486 174/250 |
| 7,813,082 B2* | 10/2010 | Rice | | G11B 5/4826 360/245.9 |
| 7,826,177 B1* | 11/2010 | Zhang | | G11B 5/4826 360/245.3 |
| 8,045,296 B1* | 10/2011 | Roen | | G11B 5/4853 360/245.8 |
| 8,106,408 B2* | 1/2012 | Ban | | H01L 31/0203 174/254 |
| 8,119,921 B1* | 2/2012 | Goergen | | H05K 1/111 174/255 |
| 8,169,746 B1* | 5/2012 | Rice | | G11B 5/486 360/245.9 |
| 8,208,227 B2* | 6/2012 | Ohsawa | | G11B 5/486 360/245.9 |
| 8,361,896 B2* | 1/2013 | De Geest | | H05K 1/0231 438/607 |
| 8,390,958 B2* | 3/2013 | Ohnuki | | H05K 3/0061 360/245.9 |
| 8,395,055 B2* | 3/2013 | Iguchi | | G11B 5/486 174/254 |
| 8,514,522 B1* | 8/2013 | Pan | | G11B 5/4826 324/755.01 |
| 8,547,663 B2* | 10/2013 | Sugimoto | | G11B 5/486 174/250 |
| 8,658,903 B2* | 2/2014 | Kamei | | G11B 5/486 174/254 |
| 8,760,815 B2* | 6/2014 | Ishii | | G11B 5/484 360/245.8 |
| 8,847,696 B2* | 9/2014 | Blair | | H01P 3/00 333/238 |
| 8,878,560 B2* | 11/2014 | Kuo | | G01R 1/06772 29/593 |
| 9,064,513 B1* | 6/2015 | Pan | | G11B 5/486 |
| 9,077,168 B2* | 7/2015 | Lin | | H02G 15/08 |
| 9,295,156 B2* | 3/2016 | Ichinose | | H05K 1/118 |
| 2003/0174529 A1* | 9/2003 | Forbes | | G11C 5/063 365/51 |
| 2003/0176023 A1* | 9/2003 | Forbes | | G11C 7/02 438/186 |
| 2003/0176053 A1* | 9/2003 | Forbes | | H01L 23/5225 438/598 |
| 2003/0180011 A1* | 9/2003 | Aronson | | H01R 23/688 385/92 |
| 2003/0214860 A1* | 11/2003 | Greenlaw | | H05K 1/025 365/200 |
| 2004/0057220 A1* | 3/2004 | Tamaki | | H01P 5/085 361/760 |
| 2005/0018409 A1* | 1/2005 | Hirakata | | H05K 1/028 361/752 |
| 2005/0024885 A1* | 2/2005 | Schmidt | | B60Q 1/0483 362/485 |
| 2005/0045374 A1* | 3/2005 | Kumar | | H05K 1/118 174/254 |
| 2005/0061542 A1* | 3/2005 | Aonuma | | H05K 3/243 174/255 |
| 2005/0122627 A1* | 6/2005 | Kanagawa | | G11B 5/486 360/245.9 |
| 2005/0190006 A1* | 9/2005 | Noda | | H01P 3/08 333/1 |
| 2006/0200977 A1* | 9/2006 | Lauffer | | H01L 23/552 29/830 |
| 2007/0102830 A1* | 5/2007 | Muto | | H05K 1/0219 257/784 |
| 2007/0253176 A1* | 11/2007 | Ishii | | G11B 5/486 361/760 |
| 2008/0029293 A1* | 2/2008 | Ooyabu | | G11B 5/486 174/250 |
| 2009/0008131 A1* | 1/2009 | Shibata | | H05K 1/0219 174/254 |
| 2009/0044968 A1* | 2/2009 | Pai | | H05K 1/0224 174/254 |
| 2009/0078452 A1* | 3/2009 | Pai | | H05K 1/0245 174/254 |
| 2009/0101399 A1* | 4/2009 | Iguchi | | G11B 5/486 174/260 |
| 2009/0126970 A1* | 5/2009 | Sasaki | | C08J 5/18 174/110 SR |
| 2009/0133906 A1* | 5/2009 | Baek | | H05K 1/0218 174/254 |
| 2009/0188699 A1* | 7/2009 | Lin | | H05K 1/0245 174/250 |
| 2009/0188711 A1* | 7/2009 | Ahmad | | H05K 1/0245 174/262 |
| 2009/0191377 A1* | 7/2009 | Chuang | | D03D 1/0082 428/107 |
| 2009/0242259 A1* | 10/2009 | Ho | | H05K 1/0218 174/261 |
| 2009/0255717 A1* | 10/2009 | Mizushima | | H05K 3/44 174/255 |
| 2009/0260859 A1* | 10/2009 | Pai | | H05K 1/0224 174/254 |
| 2009/0260860 A1* | 10/2009 | Pai | | H05K 1/0224 174/254 |
| 2009/0294155 A1* | 12/2009 | Suzuki | | H05K 1/0218 174/254 |
| 2010/0015822 A1* | 1/2010 | Morgan | | H01R 13/514 439/83 |
| 2010/0116590 A1* | 5/2010 | Rund | | E06C 5/04 182/127 |
| 2010/0118443 A1* | 5/2010 | Ohsawa | | G11B 5/4853 360/245.8 |
| 2010/0244871 A1* | 9/2010 | Blair | | G01R 1/07378 324/756.05 |
| 2010/0258338 A1* | 10/2010 | Hsu | | H05K 1/024 174/254 |
| 2010/0276183 A1* | 11/2010 | Ookawa | | H05K 1/0245 174/254 |
| 2010/0307798 A1* | 12/2010 | Izadian | | H01L 24/24 174/255 |

(56) References Cited

U.S. PATENT DOCUMENTS

| | | | | |
|---|---|---|---|---|
| 2010/0314159 A1* | 12/2010 | Lee | H05K 1/0224 | 174/254 |
| 2010/0315752 A1* | 12/2010 | Rabu | H01R 31/06 | 361/103 |
| 2010/0326706 A1* | 12/2010 | Muro | H05K 1/0218 | 174/254 |
| 2011/0019371 A1* | 1/2011 | Hsu | H05K 1/0245 | 361/749 |
| 2011/0048771 A1* | 3/2011 | Satomi | H05K 1/025 | 174/254 |
| 2011/0088842 A1* | 4/2011 | Goergen | H01P 3/081 | 156/309.6 |
| 2011/0100694 A1* | 5/2011 | Regnier | H01R 13/6658 | 174/260 |
| 2011/0121922 A1* | 5/2011 | Blair | H01P 3/00 | 333/238 |
| 2011/0132641 A1* | 6/2011 | Wong | H01P 3/121 | 174/254 |
| 2011/0259632 A1* | 10/2011 | Oosawa | H05K 1/0245 | 174/266 |
| 2011/0308840 A1* | 12/2011 | Ooi | H05K 1/0366 | 174/251 |
| 2012/0025924 A1* | 2/2012 | Yamauchi | H05K 1/0245 | 333/4 |
| 2012/0061129 A1* | 3/2012 | Lai | H05K 1/111 | 174/257 |
| 2012/0067626 A1* | 3/2012 | Mizutani | G03F 7/0045 | 174/255 |
| 2012/0138340 A1* | 6/2012 | Kato | H05K 1/028 | 174/251 |
| 2012/0138344 A1* | 6/2012 | Lai | H05K 1/0245 | 174/255 |
| 2012/0175151 A1* | 7/2012 | Mizutani | G11B 5/4853 | 174/250 |
| 2012/0224281 A1* | 9/2012 | Arai | G11B 5/4833 | 360/244.2 |
| 2012/0247826 A1* | 10/2012 | Chow | H05K 1/0218 | 174/350 |
| 2012/0292085 A1* | 11/2012 | Watanabe | H05K 1/024 | 174/254 |
| 2013/0020112 A1* | 1/2013 | Ohsawa | G11B 5/486 | 174/255 |
| 2013/0048344 A1* | 2/2013 | Lou | H05K 1/0237 | 174/251 |
| 2013/0081868 A1* | 4/2013 | Lee | H05K 1/0225 | 174/261 |
| 2013/0099876 A1* | 4/2013 | Kushta | H01P 1/203 | 333/134 |
| 2013/0105208 A1* | 5/2013 | Higuchi | G11B 5/486 | 174/258 |
| 2013/0133939 A1* | 5/2013 | Ishii | H05K 1/115 | 174/262 |
| 2013/0147581 A1* | 6/2013 | Kato | H05K 1/0253 | 333/238 |
| 2013/0319743 A1* | 12/2013 | Ishii | H05K 1/0296 | 174/260 |
| 2013/0319748 A1* | 12/2013 | Ishii | H05K 1/0298 | 174/262 |
| 2014/0027165 A1* | 1/2014 | Morita | H05K 1/0306 | 174/258 |
| 2014/0158406 A1* | 6/2014 | Kato | H05K 1/024 | 174/250 |
| 2014/0266505 A1* | 9/2014 | Meyer | H01F 19/04 | 333/175 |
| 2014/0333329 A1* | 11/2014 | Jeong | H05K 1/0268 | 324/671 |
| 2015/0305142 A1* | 10/2015 | Matsuda | H05K 1/024 | 333/238 |

* cited by examiner

PRINTED CIRCUIT BOARD INCLUDING LINKING EXTENDED CONTACT PAD

CROSS-REFERENCE TO RELATED APPLICATIONS

This application claims the benefit of Korean Patent Application No. 10-2013-0107548, filed on Sep. 9, 2013, and Korean Patent Application No. 10-2013-0160622, filed on Dec. 20, 2013, in the Korean Intellectual Property Office, the disclosures of which are incorporated herein in their entirety by reference.

FIELD

The present disclosure relates to a printed circuit board used as a signal transmission line of a terminal.

BACKGROUND

Internal circuits of wireless communication devices are generally provided on printed circuit boards (PCBs). Such PCB technologies have been rapidly developed. Currently, there are generally used not only typical hard PCBs but also flexible PCBs (FPCBs) freely movable.

On the other hand, as a high frequency line used in wireless terminals such as mobile phones, particularly, a radio frequency (RF) line, generally a coaxial cable is used. However, since an internal space of a wireless terminal is small and various kinds of circuit modules are mounted thereon, it is not easy to form a communication line using the coaxial cable in such space.

Accordingly, it is necessary to provide a transmission line capable of effectively transmitting a high frequency signal without noise while doing no harm on other modules. With respect to this, a structure, in which a signal is transmitted inside a wireless terminal using an FPCB, has been provided.

However, in this case, signals are merely transmitted using the FPCB. There is not disclosed a structure capable of being simply assembled, being optimized for impedance matching, and minimizing a loss of signals.

Korean Patent No. 10-1153165 B1 describes a high frequency telecommunication line.

SUMMARY

One or more embodiments of the present invention include a printed circuit board (PCB) capable of simplifying a process of assembling the PCB inside a terminal and making better use of a space.

One or more embodiments of the present invention include a PCB capable of reducing impedance mismatching and a loss of a signal.

Additional aspects will be set forth in part in the description which follows and, in part, will be apparent from the description, or may be learned by practice of the presented embodiments.

According to one or more embodiments of the present invention, a PCB includes a first ground layer elongating in one direction, a first dielectric layer deposited on a top of the first ground layer and elongating in the same direction as the first ground layer, a signal transmission line deposited on a top of the first dielectric layer and elongating in the same direction as the first dielectric layer, a ground pad elongating from one end of the first ground layer and in contact with an external ground, and a signal line pad extended from one end of the signal transmission line and in contact with an external signal line.

The PCB may further include a second dielectric layer deposited on a top of the signal transmission line and a second ground layer deposited on a top of the second dielectric layer.

The PCB may further include a ground pad area formed on a bottom of the one end of the first dielectric layer while the signal line pad is formed on a bottom of the ground pad area. The ground pad may be formed on a bottom of one end of the first ground layer, and the ground pad area may be electrically segregated from the first ground layer by etching a peripheral portion of the first ground layer, on which the signal line pad is deposited.

The ground pad area may be connected to the signal transmission line through a via hole formed in the first dielectric layer.

The ground pad and the signal line pad may have one of a hexagonal shape and a circular shape.

A portion extended from the one end of the first ground layer and connected to the ground pad may have a width identical to a width of the ground pad.

The ground pad and the signal line pad may flush with each other.

The ground pad and the signal line pad may be disposed on the one end of the first dielectric layer in a direction vertical to the direction, in which the signal transmission line elongates.

The ground pad and the signal line pad may be disposed on the one end of the first dielectric layer in the direction, in which the signal transmission line elongates.

The ground pad may have a hollow formed therein and is disposed to surround an edge of the signal line pad. The signal line pad may be formed as a circular shape.

The ground pad and the signal line pad may be formed on different surfaces.

The PCB may further include a ground pad area formed on a top of one end of the second dielectric layer while the signal line pad is formed on a top of the ground pad area. The ground pad may be formed on a bottom of one end of the first ground layer, and the ground pad area may be electrically segregated from the first ground layer by etching a peripheral portion of the first ground layer, on which the signal line pad is deposited.

The ground pad area may be connected to the signal transmission line through a via hole formed in the second dielectric layer.

The ground pad and the signal line pad may be formed in locations vertically corresponding to each other.

The PCB may include a plurality of first ground patterns formed in a row with certain intervals along a center of a bottom surface of the first ground layer in a longitudinal direction of the first ground layer by etching the bottom surface of the first ground layer. The plurality of first ground patterns may expose the first dielectric layer.

The PCB may include a slot pattern area formed by etching a part of the signal transmission line except an edge thereof to a thickness of the signal transmission line in a longitudinal direction of the signal transmission line. Currents may flow while being dispersed into both edges of the signal transmission line divided by the slot pattern area.

BRIEF DESCRIPTION OF THE DRAWINGS

These and/or other aspects will become apparent and more readily appreciated from the following description of the embodiments, taken in conjunction with the accompanying drawings of which.

DETAILED DESCRIPTION

Figure 1:
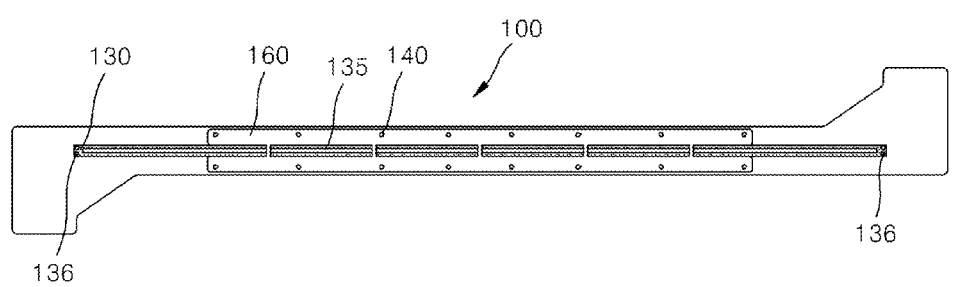
FIG. 1 is a top view of a printed circuit board (PCB) according to an embodiment of the present invention.

Hereinafter, exemplary embodiments of the present invention will be described in detail with reference to the attached drawings.

The embodiments of the present invention are provided to more perfectly explain the inventive concept to a person of ordinary skill in the art. The following embodiments may be changed into various other forms but the scope of the inventive concept is not limited thereto. The embodiments are provided to allow the present disclosure to be more faithful and perfect and to fully transfer the inventive concept to those skilled in the art.

Terms used in the specification are to describe particular embodiments and do not limit the inventive concept. As used herein, the singular forms "a," "an" and "the" are intended to include the plural forms as well, unless the context clearly indicates otherwise. It will be further understood that the terms "comprises" and/or "comprising" used herein specify the presence of stated shapes, numbers, operations, elements, and/or a group thereof, but do not preclude the presence or addition of one or more other shapes, numbers, operations, elements, and/or groups thereof. As used herein, the term "and/or" includes any and all combinations of one or more of the associated listed items.

It will be understood that although the terms "first", "second", etc. may be used herein to describe various components, these components should not be limited by these terms. The terms do not mean a particular order, top and bottom, or merits and demerits but are only used to distinguish one component from another. Accordingly, a first element, area, or portion that will be described below may indicate a second element, area, or portion without deviating from teachings of the inventive concept.

Hereinafter, the embodiments of the inventive concept will be described with reference to schematic drawings. In the drawings, for example, according to manufacturing technologies and/or tolerances, illustrated shapes may be modified. Accordingly, the embodiments of the inventive concept will not be understood to be being limited to certain shapes of illustrated areas but will include variances in shapes caused while being manufactured.

Printed circuit boards (PCBs) disclosed herein may be general PCBs or flexible PCBs (FPCBs).

Figure 2:
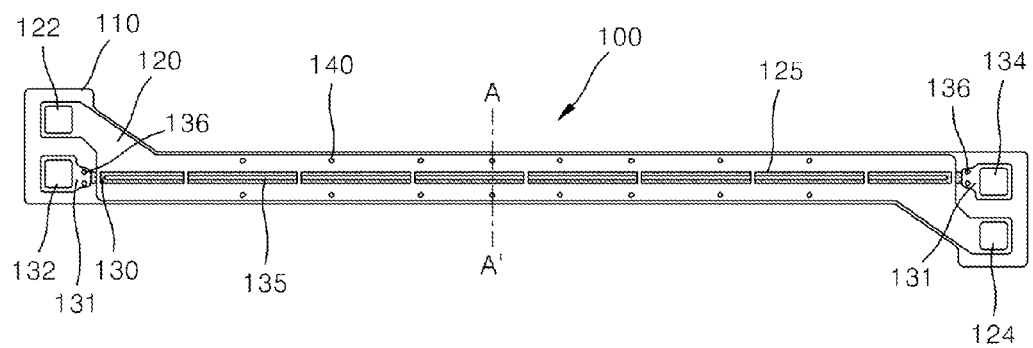
FIG. 2 is a bottom view of the PCB of FIG. 1.
Figure 3:
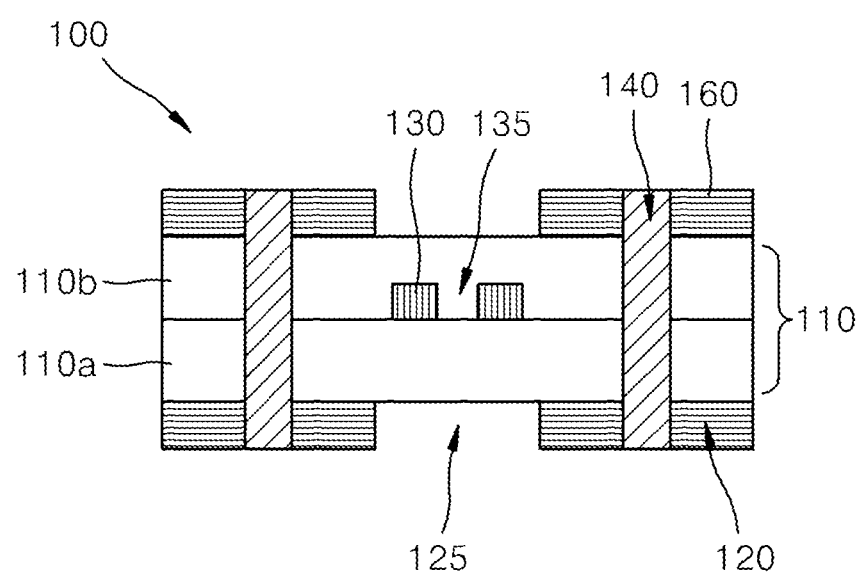
FIG. 3 is a cross-sectional view illustrating a part taken along a line A-A' of FIG. 1.

FIG. 1 is a top view illustrating a printed circuit board (PCB) 100 according to an embodiment of the present invention, FIG. 2 is a bottom view of the PCB 100, and FIG. 3 is a cross-sectional view illustrating a part taken along a line A-A' of FIG. 1.

Referring to FIGS. 1 to 3, the PCB 100 includes a first ground layer 120, a first dielectric layer 110a, a signal transmission line 130, a second dielectric layer 110b, and a second ground layer 160.

The first ground layer 120, the first dielectric layer 110a, the signal transmission line 130, the second dielectric layer 110b, and the second ground layer 160 are sequentially deposited and elongate in the same direction.

Although the signal transmission line 130 is shown as being exposed outward in FIGS. 1 and 2, actually, the signal transmission line 130 is disposed inside a dielectric layer 110 and is shown while penetrating the dielectric layer 110. When the dielectric layer 110 is opaque or thick, the signal transmission line 130 does not penetrate the dielectric layer 110 and is not shown.

The first ground layer 120 is formed of a metallic material such as copper and is grounded. The first dielectric layer 110a is formed of a dielectric material such as polyimide. The signal transmission line 130 is formed of a metallic material such as copper.

The second dielectric layer 110b is also formed of the same material as the first dielectric layer 110a. The second ground layer 160 is formed of the same material as the first ground layer 120.

The first ground layer 120, the first dielectric layer 110a, the signal transmission line 130, the second dielectric layer 110b, and the second ground layer 160 are formed to elongate in a longitudinal direction as shown in FIG. 2.

FIG. 3 is a side cross-sectional view of the PCB 100. The first ground layer 120, the first dielectric layer 110a, the signal transmission layer 130, the second dielectric layer 110b, and the second ground layer 160 are sequentially deposited. The first ground layer 120 and the second ground layer 160 are connected to each other through a via hole 140 formed of a hole penetrating the dielectric layer 110 and filled with a metallic material such as copper.

Referring to FIG. 2, an area of the dielectric layer 110 is formed on both ends of the PCB 100 to be broader. Ground pads 122 and 124 and signal line pads 132 and 134 are formed respectively in a direction vertical to the direction, in which the signal transmission line 130 elongates.

The ground pads 122 and 124 are formed below the first ground layer 120, and in more detail, are formed below the first ground layer 120 extended in both sides of the PCB 100.

Similarly, the signal line pads 132 and 134 are connected to the signal transmission line 130, and in more detail, are formed below a ground pad area 131 formed below the dielectric layer 110 extended in the both sides of the PCB 100.

As shown in FIG. 2, the ground pad area 131 formed with the signal line pads 132 and 134 is electrically segregated from the first ground layer 120 formed with the ground pads 122 and 124.

That is, the ground pad area 131 is a part of the first ground layer 120 and is substantially same as the first ground layer 120 but is electrically segregated by etching. In detail, the first ground layer 120 is deposited overall on a top of the PCB 100 and then a peripheral part to be formed with the signal line pads 132 and 134 is etched, thereby forming the ground pad area 131 electrically segregated from the first ground layer 120.

Also, the ground pad area 131 formed with the signal line pads 132 and 134 is electrically connected to the signal transmission line 130 through a via hole 136 formed to expose the signal transmission line 130 formed in the dielectric layer 110 and filled with a metallic material such as copper.

As shown in FIG. 3, the signal transmission line 130 is formed in the dielectric layer 110 and is connected to the ground pad area 131 through the via hole 136 formed in the dielectric layer 110 on the both ends of the PCB 100. The ground pad area 131 is connected to the signal line pads 132 and 134.

Also, in case of the PCB 100, as shown in FIGS. 1 to 3, the first and second ground layers 120 and 160 include a plurality of ground patterns 125. The plurality of ground patterns 125 are formed by etching the first and second ground layers 120 and 160 till the dielectric layer 110 is exposed. FIG. 3 is the side cross-sectional view of the part A-A' of FIG. 2. The ground patterns 125 formed by etching centers of the first and second ground layers 120 and 160 to be removed.

The ground patterns 125, as shown in FIGS. 1 and 2, may be formed in a row with certain intervals in a longitudinal direction of the PCB 100. The plurality of ground patterns 125 may have a rectangular shape as shown in FIGS. 1 and 2 or may have other shapes.

To reduce conduct loss, it is necessary to increase a width of a signal transmission line. However, when the width of the signal transmission line is increased, a capacitance between the signal transmission line and a ground layer increases, thereby decreasing impedance. Accordingly, when the width of the signal transmission line is increased, impedance mismatching occurs.

However, the first and second ground layers 120 and 160 of the PCB 100 decrease in area due to the ground patterns 125. In this case, a capacitance between the signal transmission line 130 and the first and second ground layers 120 and 160 decreases, thereby increasing impedance. Accordingly, in case of the PCB 100, the width of the signal transmission line 130 becomes greater without impedance mismatching.

Also, the signal transmission line 130 of the PCB 100, as shown in FIGS. 1 to 3, includes a slot pattern area 135 formed by etching a part of the signal transmission line 130, except an edge, in a longitudinal direction of the signal transmission line 130 as a thickness of the signal transmission line 130.

That is, referring to FIGS. 1 and 2, the slot pattern area 135 is formed as a band shape in the longitudinal direction of the signal transmission line 130 as the thickness of the signal transmission line 130. Since the slot pattern area 135 is etched to the thickness of the signal transmission line 130, the signal transmission line 130 is divided into signal transmission patterns on both sides disposing the slot pattern area 135 in a center therebetween.

Accordingly, in the PCB 100, since the signal transmission line 130 is divided into two signal transmission patterns in an area formed with the slot pattern area 135, currents flow while being dispersed into both edges of the two signal transmission patterns. That is, the currents flow while being dispersed into four parts, i.e., the both edges of the two separate signal transmission patterns. On the contrary, in case of a PCB without a slot pattern area, currents flow while being dispersed into two parts, that is, both edges of a signal transmission line. Accordingly, in case of the PCB 100, an area, in which a current flows, becomes relatively larger, thereby reducing a loss of the signal transmission line 100.

The slot pattern area 135, as shown in FIGS. 1 and 2, may be formed along a center in the longitudinal direction of the signal transmission line 130. However, the slot pattern area 135 may be formed in another area besides in the center of the signal transmission line 130 unless being formed adjacent to the edge of the signal transmission line 130. For example, the slot pattern area 135 may be formed as a band in the longitudinal direction of the signal transmission line 130 in a location deviated with a certain distance from the center toward the edge.

In FIGS. 1 to 3, the slot pattern area 135 formed in the PCB 100 indicates that one long slot pattern area 135 is formed in the signal transmission line 130 in the longitudinal direction thereof. Since the ground patterns 125 are disposed in a row with the certain intervals in FIGS. 1 and 2, the slot pattern area 135 is shown through the ground patterns 125 as being disposed with the certain intervals. However, the one long slot pattern area 135 is formed inside the dielectric layer 110.

However, the slot pattern area 135 may be formed as one in the longitudinal direction as described above but may be formed in a row with certain intervals like the ground patterns 125. As long as an area, through which currents flow, becomes increased, besides such patterns, various patterns may be used.

Also, the second ground layer 160 of the PCB 100, as shown in FIG. 2, may increase in flexibility by partially removing the both sides of the PCB 100.

Figure 4:
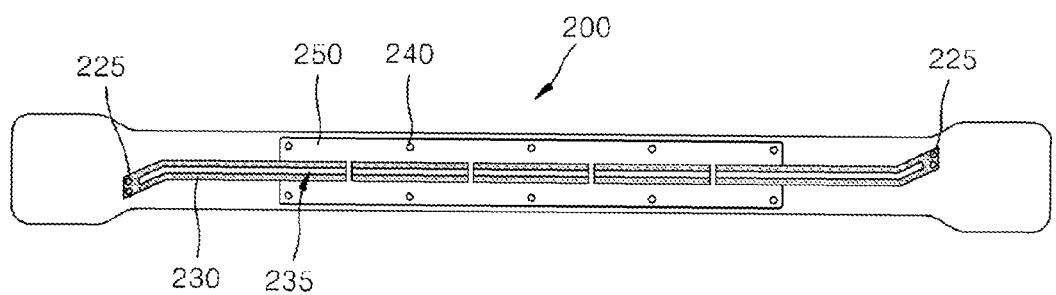
FIG. 4 is a top view of a PCB according to another embodiment of the present invention.
Figure 5:
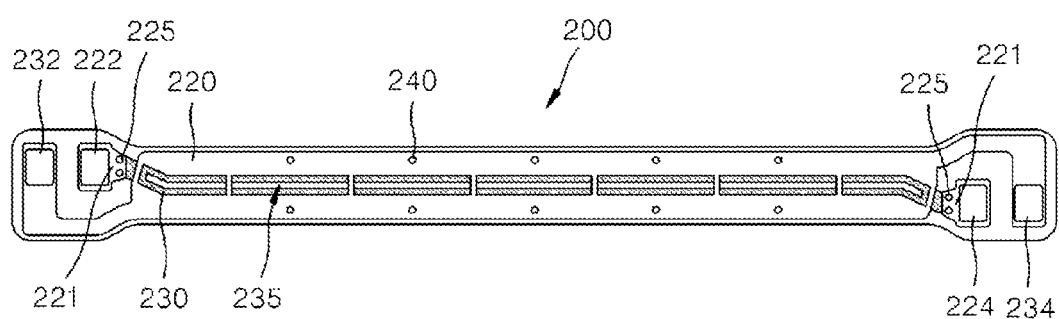
FIG. 5 is a bottom view of the PCB of FIG. 4.

FIG. 4 is a top view of a PCB 200 according to another embodiment of the present invention, and FIG. 5 is a bottom view of the PCB 200.

The PCB 200 of FIGS. 4 and 5 only has a difference in disposing pads formed on both ends thereof from the PCB 100 of FIGS. 1-3. Accordingly, since differing only in reference numerals and having a similar structure thereto, a detailed description thereof will be omitted.

That is, as shown in FIGS. 4 and 5, the PCB 200 includes a first ground layer 220 and a second ground layer 250 disposed on top and bottom of the a dielectric layer. In the dielectric layer, a signal transmission line 230 is disposed. As shown in FIGS. 4 and 5, the signal transmission line 230 is shown through ground patterns. In a center of the signal transmission line 230, as described above, a slot pattern area 235 is formed.

As shown in FIG. 5, a dielectric layer area is formed on both edges of the PCB 200 to be broader. Differently, ground pads 232 and 234 and signal line pads 222 and 224 are formed in a direction, in which the signal transmission line 230 elongates.

As described above, when disposing the ground pads 232 and 234 and the signal line pads 222 and 224 in the direction, in which the signal transmission line 230 elongates, an extent of the dielectric layer area may be more reduced, thereby miniaturizing the PCB 200.

Figure 6:
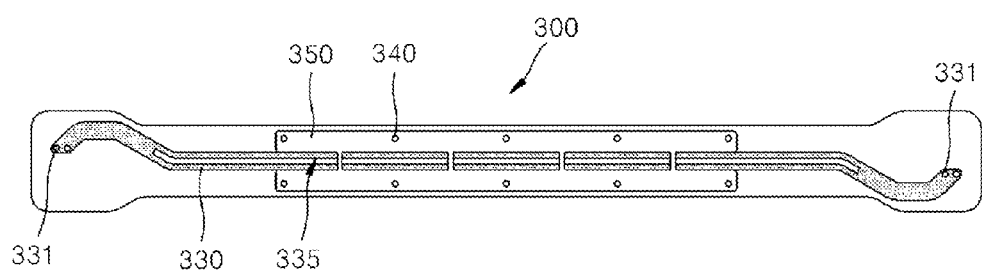
FIG. 6 is a top view of a PCB according to still another embodiment of the present invention.
Figure 7:
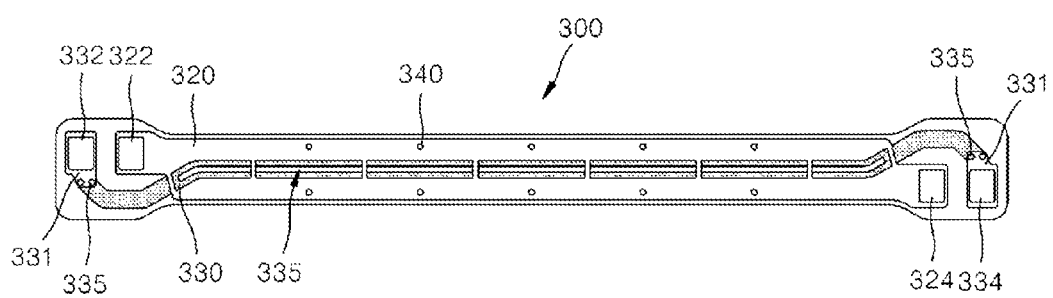
FIG. 7 is a bottom view of the PCB of FIG. 6.

FIG. 6 is a top view of a PCB 300 according to still another embodiment of the present invention, and FIG. 7 is a bottom view of the PCB 300.

The PCB 300 in FIGS. 6 and 7 is substantially identical to the PCB 200 of FIGS. 4 and 5, except reversing locations of signal line pads and ground Pads. Accordingly, since differing only in reference numerals and having a similar structure thereto, a detailed description thereof will be omitted.

That is, ground pads 322 and 324 may be disposed to be more adjacent to a center of the PCB 300 and signal line pads 332 and 334 may be disposed on very ends of the PCB 300.

Figure 8:
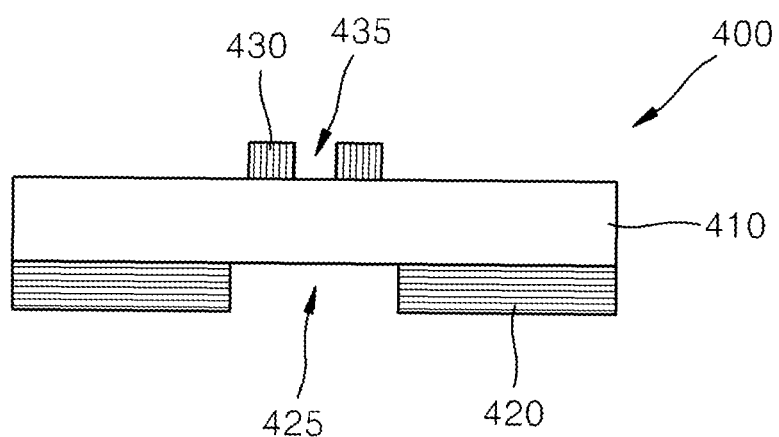
FIG. 8 is a side cross-sectional view of a PCB according to even another embodiment of the present invention.

FIG. 8 is a side cross-sectional view of a PCB 400 according to even another embodiment of the present invention.

As described above, the PCB 100 has a three-layered structure including the two ground layers 120 and 160 and the signal transmission line 130. The PCB 400 is formed to have a two-layered structure including a first ground layer 420 and a signal transmission line 430.

That is, as shown in FIG. 8, the first ground layer 420 is disposed on a very bottom, a first dielectric layer 410 is disposed on a top of the first ground layer 420, and the signal transmission line 430 is disposed on a top of the first dielectric layer 410.

Herein, similar to the PCB 100, the first ground layer 420 may be formed with ground patterns 425 and the signal transmission line 430 may be formed with a slot pattern area 435.

FIG. 9A is a top view of a PCB 600 according to yet another embodiment of the present invention, and FIG. 9B is a bottom view of the PCB 600.

Figure 9:
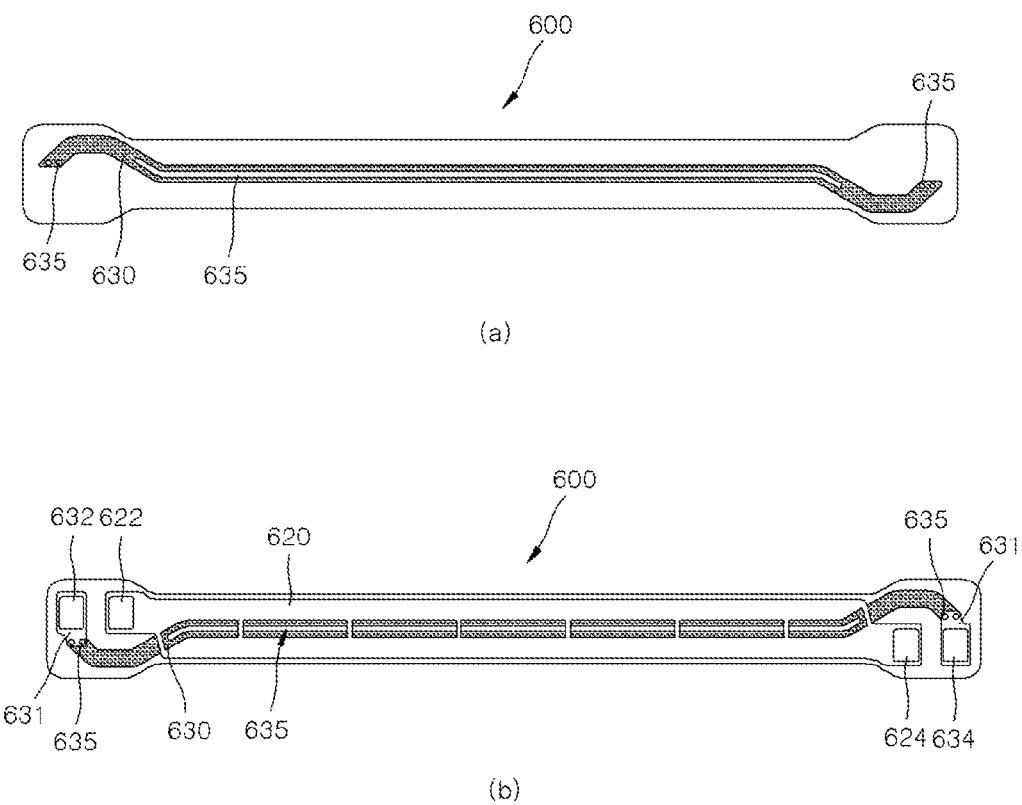
FIGS. 9A and 9B are a top view and a bottom view of a PCB according to yet another embodiment of the present invention.

The PCB 600 has a structure similar to the PCB 300 of FIGS. 6 and 7. Merely, the PCB 600 of FIGS. 9A and 9B has a two-layered structure as the PCB 400 of FIG. 8. That is, a signal transmission line 630 is formed on a top of a dielectric layer, and as shown in FIG. 9, is connected to a ground pad area 631 formed on a bottom of the dielectric layer through a via hole. Also, a ground pad area 631 is connected to signal line pads 632 and 634. Also, ground pads 622 and 624 are formed on a top of a first ground layer 620 and the first ground layer 620 is connected to the ground pads 622 and 624. A detailed description on a slot pattern area 635, etc., differing in reference numerals from FIG. 7 but having the same components as FIG. 7, will be omitted.

As described above, in FIGS. 9A and 9B, since the ground pads 622 and 624 and the signal line pads 632 and 634 are disposed in a longitudinal direction of the PCB 600, an extent of a dielectric layer area formed with pads may be decreased, thereby miniaturizing the PCB 600.

Also, although the disposition of the ground pads 622 and 624 and the signal line pads 632 and 634 of the PCB 600 having the two-layered structure has been described referring to the disposition of the ground pads 322 and 324 and the signal line pads 332 and 334, the dispositions of the ground pads and the signal line pads in the PCBs 100 and 200 may be available.

Figure 10:
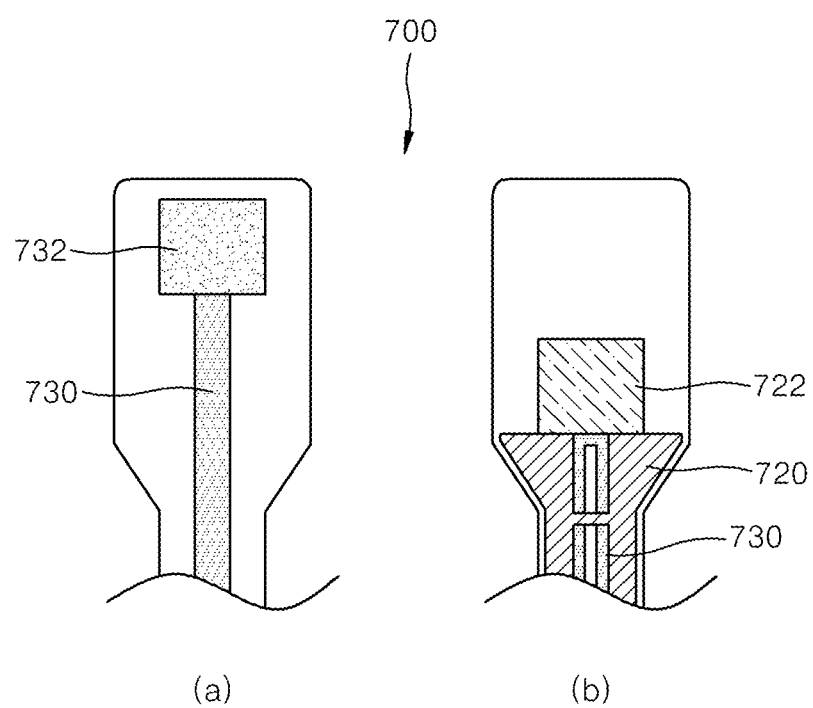
FIGS. 10A and 10B are a top view and a bottom view of a PCB according to a further embodiment of the present invention.

FIGS. 10A and 10B are a top view and a bottom view of a PCB 700 according to a further embodiment of the present invention.

The PCB 700 includes a ground pad 722 and a signal line pad 732, formed on different surfaces of a dielectric layer, respectively.

The PCB 700 may have the structure of FIG. 3, in which a signal transmission line 730 is formed inside the dielectric layer and is connected to the signal line pad 732 formed on a top of the PCB 700. A first ground layer 720 is connected to the ground pad 722 formed on a bottom of the PCB 700.

FIGS. 11A and 11B are a top view and a bottom view of a PCB 800 according to a still further embodiment of the present invention.

Figure 11:
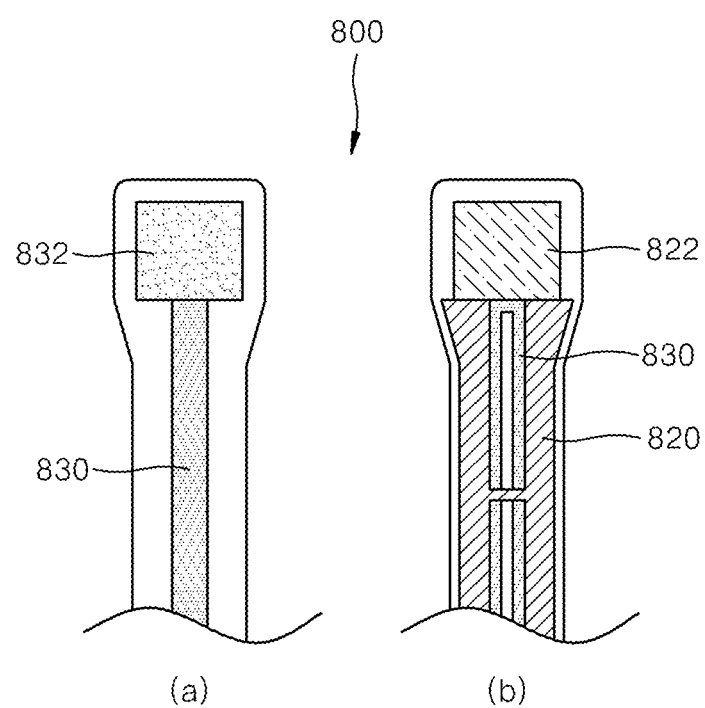
FIGS. 11A and 11B are a top view and a bottom view of a PCB according to a still further embodiment of the present invention.

The PCB 800 in FIG. 11 has a structure identical to that of the PCB 700 of FIGS. 10A and 10B, except forming of pads to correspond to one another. Accordingly, since differing only in reference numerals and having a similar structure thereto, a detailed description thereof will be omitted.

That is, in case of the PCB 800, since being formed in locations vertically corresponding to each other, a signal line pad 832 and a ground pad 822 may be used in a case, in which contact points of an external signal line and an external ground line are disposed to vertically correspond to one another.

On the contrary, the PCB 700 of FIGS. 10A and 10B may be used in a case, in which contact points of an external signal line and an external ground line are disposed not to vertically correspond to one another.

Figure 12:
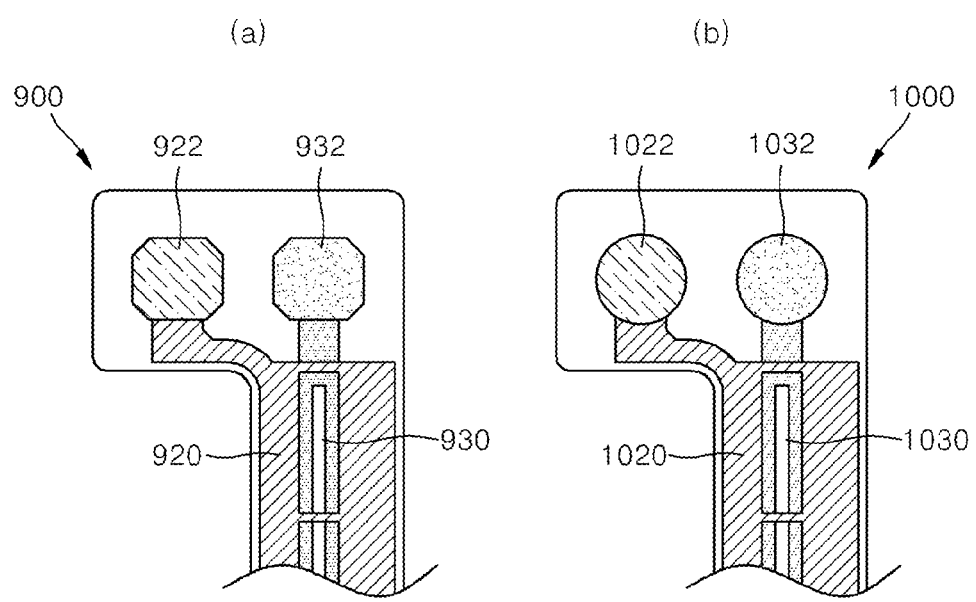
FIGS. 12A and 12B are bottom views of PCBs according to an even further embodiment of the present invention.

FIGS. 12A and 12B are bottom views of PCBs 900 and 1000 according to an even further embodiment of the present invention.

The PCB 900 of FIG. 12A includes a signal line pad 932 connected to a signal transmission line 930 and a ground pad 922 connected to a ground layer 920. The signal line pad 932 and the ground pad 922 are formed as an octagonal shape to reduce capacitances of head portions, thereby providing optimum impedance of a pad part.

Similarly, the PCB 1000 of FIG. 12B includes a signal line pad 1032 connected to a signal transmission line 1030 and a ground pad 1022 connected to a ground layer 1020. The signal line pad 1032 and the ground pad 1022 are formed as a circular shape to reduce capacitances of head portions, thereby providing optimum impedance of a pad part.

Figure 13:
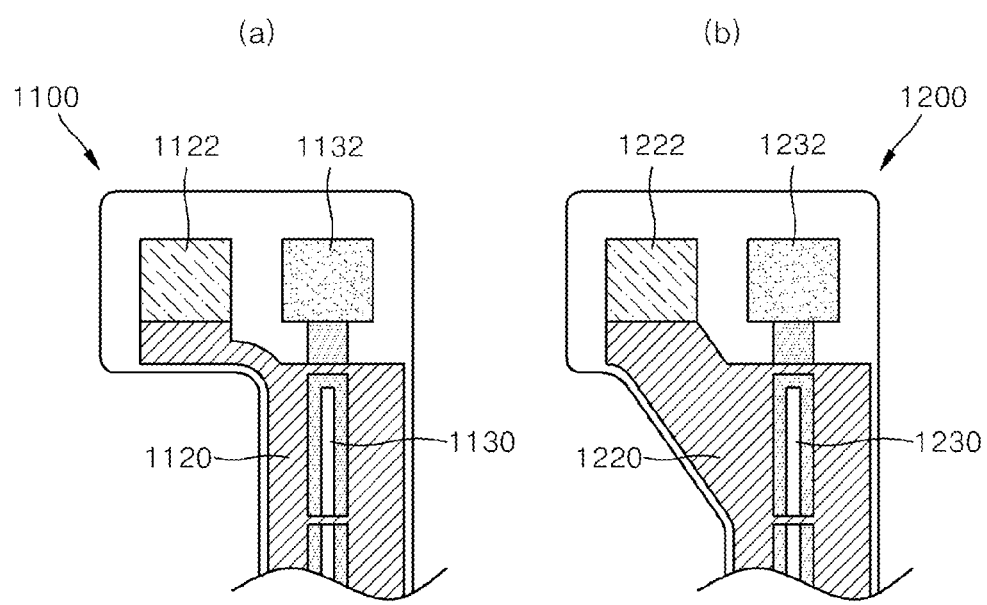
FIGS. 13A and 13B are bottom views of PCBs according to a yet further embodiment of the present invention.
Figure 14:
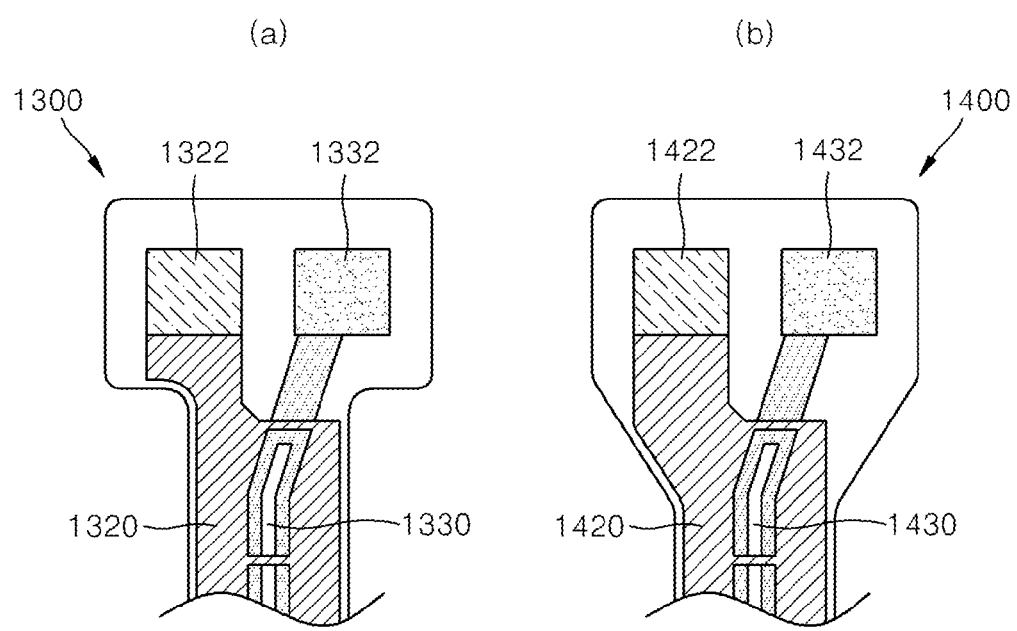
FIGS. 14A and 14B are bottom views of PCBs according to a much further embodiment of the present invention.

FIGS. 13A and 13B are bottom views of PCBs 1100 and 1200 according to a yet further embodiment of the present invention, and FIGS. 14A and 14B are bottom views of PCBs 1300 and 1400 according to a much further embodiment of the present invention.

FIGS. 13A to 14B feature forming a portion connecting a ground layer to a ground pad to have a thickness identical to that of the ground pad.

That is, the PCB 1110 of FIG. 13A includes a signal line pad 1132 connected to a signal transmission line 1130 and a ground pad 1122 connected to a ground layer 1120. A portion connecting the ground layer 1120 to the ground pad 1122 is formed to be thin as shown in FIG. 13A.

On the other hand, the PCB 1200 of FIG. 13B includes a signal line pad 1232 connected to a signal transmission line 1230 and a ground pad 1222 connected to a ground layer 1220. A portion connecting the ground layer 1220 to the ground pad 1222 is formed to have a width identical to a width of the ground pad 1222, thereby increasing radio frequency (RF) properties and reducing an inflow of noise.

Although it is shown as an example that the width of the portion connecting the ground layer 1120 to the ground pad 1222 is identical to the width of the ground pad 1222, so far as the inflow of noise may be minimized, the width of the portion may be formed to be smaller or greater than the width of the ground pad 1222.

FIGS. 14A and 14B illustrate PCBs 1300 and 1400 similar to FIGS. 13A and 13B and only have a difference in a structure, in which ends of a dielectric layer are extended while being opposite to each other in the left and right of a PCB body.

Accordingly, since differing only in reference numerals and having a similar structure thereto, a detailed description thereof will be omitted.

Figure 15:
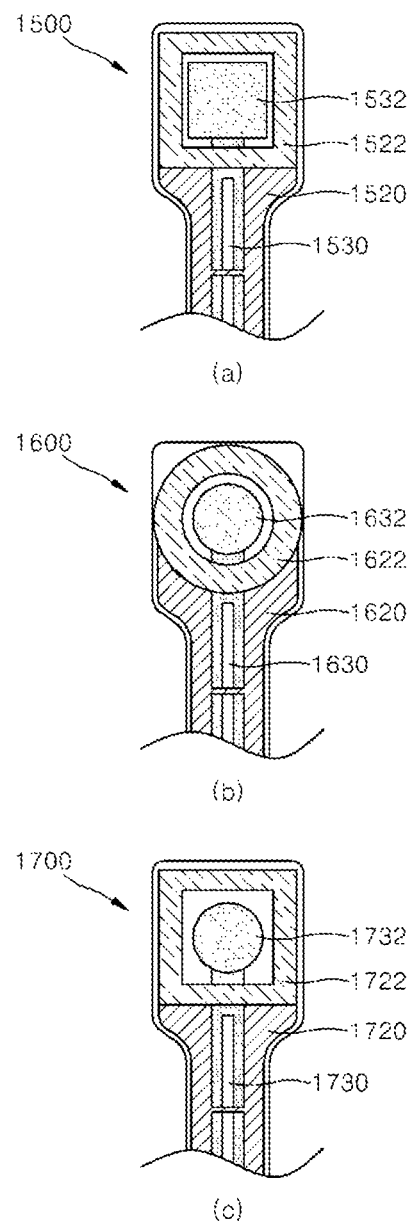
FIGS. 15A, 15B, and 15C are bottom views of PCBs according to a still much further embodiment of the present invention.

FIGS. 15A, 15B, and 15C are bottom views of PCBs 1500, 1600, and 1700 according to a much further embodiment of the present invention.

In all three examples of FIGS. 15A, 15B, and 15C, a ground pad is formed surrounding a signal line pad.

In FIG. 15A, the PCB 1500 may have one of a two-layered structure and a three-layered structure to allow a signal transmission line 1530 to be formed on a top of a dielectric layer and to be connected to a signal line pad 1532 formed on a bottom of the dielectric layer through a via hole.

On the other hand, a ground layer 1520 is formed on the bottom of the dielectric layer and a ground pad 1522 may be connected while being connected to the ground layer 1520. The ground pad 1522 may be formed as a quadrangular shape formed with a hollow thereinside to surround a signal line pad 1532 formed as a quadrangular shape in the hollow.

Since two pads may be formed in a narrow space allowing only one pad by using a structure described above, a spatial limitation of a pad area formed on both ends of the PCB 1500 may be overcome. Also, due to the structure, in which the ground pad 1522 surrounds the signal line pad 1532, an effect of noise may be reduced, contrasted with existing structures.

The PCB 1600 of FIG. 15B has a structure, in which a signal line pad 1632 connected to a signal transmission line 1630 and a ground pad 1622 connected to a ground layer 1620 have a circular shape. The PCB 1700 of FIG. 15C has a structure, in which a signal line pad 1732 connected to a signal transmission line 1730 has a circular shape and a ground pad 1722 connected to a ground layer 1720 has a quadrangular shape.

According to the embodiments, since a PCB is formed with a contact pad on one end or both ends thereof, a process of assembling the PCB inside a terminal may be simplified and space availability may be maximized.

Also, the PCB includes a ground pattern area and a slot pattern area, thereby reducing impedance mismatching and a loss of a signal.

It should be understood that the exemplary embodiments described therein should be considered in a descriptive sense only and not for purposes of limitation. Descriptions of features or aspects within each embodiment should typically be considered as available for other similar features or aspects in other embodiments.

While one or more embodiments of the present invention have been described with reference to the figures, it will be understood by those of ordinary skill in the art that various changes in form and details may be made therein without departing from the spirit and scope of the present invention as defined by the following claims.

What is claimed is:

1. A printed circuit board (PCB) comprising:
a first ground layer elongating in one direction;
a first dielectric layer deposited on a top of the first ground layer and elongating in the same direction as the first ground layer;
a signal transmission line deposited on a top of the first dielectric layer and elongating in the same direction as the first dielectric layer;
a ground pad elongating from one end of the first ground layer and in contact with an external ground;
a signal line pad extended from one end of the signal transmission line and in contact with an external signal line; and
a ground pad area formed on a bottom of the one end of the first dielectric layer while the signal line pad is formed on a bottom of the ground pad area,
wherein the ground pad is formed on a bottom of one end of the first ground layer, and
wherein the ground pad area is electrically segregated from the first ground layer by etching a peripheral portion of the first ground layer, on which the signal line pad is deposited.

2. The PCB of claim 1, wherein the ground pad area is connected to the signal transmission line through a via hole formed in the first dielectric layer.

3. The PCB of claim 1, wherein the ground pad and the signal line pad have one of a hexagonal shape and a circular shape.

4. The PCB of claim 1, wherein a portion extended from the one end of the first ground layer and connected to the ground pad has a width identical to a width of the ground pad.

5. The PCB of claim 1, wherein the ground pad and the signal line pad are flush with each other.

6. The PCB of claim 1, wherein the ground pad and the signal line pad are disposed on the one end of the first dielectric layer in a direction vertical to the direction, in which the signal transmission line elongates.

7. The PCB of claim 1, wherein the ground pad and the signal line pad are disposed on the one end of the first dielectric layer in the direction, in which the signal transmission line elongates.

8. The PCB of claim 1, wherein the ground pad has a hollow formed therein and is disposed to surround an edge of the signal line pad.

9. The PCB of claim 8, wherein the signal line pad is formed as a circular shape.

10. A printed circuit board (PCB) comprising:
a first ground layer elongating in one direction;
a first dielectric layer deposited on a top of the first ground layer and elongating in the same direction as the first ground layer;
a signal transmission line deposited on a top of the first dielectric layer and elongating in the same direction as the first dielectric layer;
a ground pad elongating from one end of the first ground layer and in contact with an external ground;
a signal line pad extended from one end of the signal transmission line and in contact with an external signal line;
a second dielectric layer deposited on a top of the signal transmission line; and
a second ground layer deposited on a top of the second dielectric layer,
wherein the ground pad and the signal line pad are formed on different dielectric layer surfaces.

11. The PCB of claim 10, further comprising a ground pad area formed on a top of one end of the second dielectric layer while the signal line pad is formed on a top of the ground pad area,
wherein the ground pad is formed on a bottom of one end of the second ground layer, and
wherein the ground pad area is electrically segregated from the second ground layer by etching a peripheral portion of the first ground layer, on which the signal line pad is deposited.

12. The PCB of claim 11, wherein the ground pad area is connected to the signal transmission line through a via hole formed in the second dielectric layer.

13. The PCB of claim 11, wherein the ground pad and the signal line pad are formed in locations that correspond vertically to each other.

14. The PCB of claim 1, comprising a plurality of first ground patterns formed in a row with certain intervals along a center of a bottom surface of the first ground layer in a longitudinal direction of the first ground layer by etching the bottom surface of the first ground layer,
   wherein the plurality of first ground patterns expose the first dielectric layer.

15. The PCB of claim 1, comprising a slot pattern area formed by etching a part of the signal transmission line except an edge thereof to a thickness of the signal transmission line in a longitudinal direction of the signal transmission line,
   wherein currents flow while being dispersed into both edges of the signal transmission line divided by the slot pattern area.

16. The PCB of claim 1, further comprising a second dielectric layer deposited on a top of the signal transmission line; and a second ground layer deposited on a top of the second dielectric layer.

* * * * *